(12) United States Patent
Haba et al.

(10) Patent No.: US 6,423,907 B1
(45) Date of Patent: Jul. 23, 2002

(54) COMPONENTS WITH RELEASABLE LEADS

(75) Inventors: Belgacem Haba, Cupertino; Konstantine Karavakis, Pleasanton, both of CA (US)

(73) Assignee: Tessera, Inc., San Jose, CA (US)

( * ) Notice: Subject to any disclaimer, the term of this patent is extended or adjusted under 35 U.S.C. 154(b) by 0 days.

(21) Appl. No.: 09/549,633

(22) Filed: Apr. 14, 2000

Related U.S. Application Data

(60) Continuation of application No. 09/225,669, filed on Jan. 5, 1999, which is a division of application No. 09/020,750, filed on Feb. 9, 1998.

(51) Int. Cl.$^7$ .......................... H01R 12/04; H05K 1/11
(52) U.S. Cl. ........................................ 174/261; 174/267
(58) Field of Search ................................ 174/261, 267; 257/734, 735, 773, 784; 361/772, 773, 774, 775, 776, 785, 786, 788, 789, 790, 791, 792, 793, 794, 795

(56) References Cited

U.S. PATENT DOCUMENTS

| | | | |
|---|---|---|---|
| 2,745,898 A | 5/1956 | Hurd | 174/120 SR |
| 3,426,252 A | 2/1969 | Lepselter | 317/234 |
| 3,892,646 A | 7/1975 | Lazzarini et al. | 204/181 |
| 3,911,475 A | 10/1975 | Szedon et al. | 357/72 |
| 4,321,290 A | 3/1982 | Thams | 427/289 |
| 4,353,778 A | 10/1982 | Fineman et al. | 156/644 |
| 4,385,341 A * | 5/1983 | Main | 361/403 |
| 4,601,916 A | 7/1986 | Arachtingi | 427/97 |
| 4,661,204 A | 4/1987 | Mathur et al. | 156/656 |
| 4,692,205 A | 9/1987 | Sachdev et al. | 156/643 |
| 4,714,646 A | 12/1987 | Fletcher et al. | 428/204 |
| 4,760,105 A | 7/1988 | Fuller et al. | 523/420 |
| 4,783,247 A | 11/1988 | Seibel | 204/181.1 |
| 4,844,784 A | 7/1989 | Suzuki et al. | 204/180.9 |
| 4,869,777 A | 9/1989 | Apschel et al. | 156/626 |
| 4,978,419 A | 12/1990 | Nanda et al. | 156/643 |
| 4,986,880 A | 1/1991 | Dorfman | 156/655 |
| 5,046,966 A * | 9/1991 | Snyder et al. | 439/579 |

(List continued on next page.)

FOREIGN PATENT DOCUMENTS

| | | |
|---|---|---|
| JP | 1-225197 | 9/1989 |
| WO | WO 94/03036 | 2/1994 |
| WO | WO 96/02959 | 2/1996 |
| WO | WO 97/11588 | 3/1997 |

OTHER PUBLICATIONS

Material Safety Data Sheet Coatings and Resins Group, PPG Industries, Inc. Product Code: CP32, Revised Sep. 3, 1997; Prepared Nov. 7, 1997 Product Trade Name: Powercron Paste; Chemical Family: Pigment Dispersion.

Material Safety Data Sheet Coatings and Resins Group, PPG Industries, Inc. Product Code: EIV643, Revised Sep. 15, 1997,Prepared Sep. 16, 1997 Product Trade Name: Powercron Resin; Chemical Family: Epoxy.

*Primary Examiner*—Kamand Cuneo
*Assistant Examiner*—Jeremy Norris
(74) *Attorney, Agent, or Firm*—Lerner, David, Littenberg, Krumholz & Mentlik, LLP

(57) ABSTRACT

A connection component for making connections to a microelectronic element is made by providing leads on a surface of a polymeric layer and etching the polymeric layer to partially detach the leads from the polymeric layer, leaving a portion of each lead releasably connected to the polymeric layer by a small polymeric connecting element which can be broken or peeled away from the lead. Leads in a connecting element may be covered by an insulating jacket applied by a coating process, and the insulating jacket may in turn be covered by a conductive layer so that each lead becomes a miniature coaxial cable. This arrangement provides immunity to interference and facilitates operation at high speeds.

13 Claims, 10 Drawing Sheets

U.S. PATENT DOCUMENTS

| | | | |
|---|---|---|---|
| 5,097,100 A | * 3/1992 | Jackson | 174/94 R |
| 5,148,266 A | 9/1992 | Khandros et al. | 357/80 |
| 5,329,158 A | 7/1994 | Lin | 257/666 |
| 5,346,861 A | 9/1994 | Khandros et al. | 437/209 |
| 5,378,857 A | 1/1995 | Swailes | 174/251 |
| 5,396,104 A | * 3/1995 | Kimura | 257/784 |
| 5,436,062 A | 7/1995 | Schmidt et al. | 428/200 |
| 5,476,211 A | 12/1995 | Khandros | 29/840 X |
| 5,508,476 A | 4/1996 | Dickenson | 174/261 |
| 5,518,964 A | 5/1996 | DiStefano et al. | 437/209 |
| 5,635,755 A | 6/1997 | Kinghorn | 257/666 |
| 5,679,977 A | 10/1997 | Khandros et al. | 257/692 |
| 5,685,885 A | 11/1997 | Khandros et al. | 29/841 |
| 5,734,176 A | * 3/1998 | Oldfield | 257/48 |
| 5,772,451 A | 6/1998 | Dozier, II et al. | 439/70 |
| 5,806,181 A | 9/1998 | Khandros et al. | 29/840 X |
| 5,811,882 A | 9/1998 | Latham, IV et al. | 257/776 |
| 5,829,128 A | 11/1998 | Eldridge et al. | 29/840 X |
| 5,832,601 A | 11/1998 | Eldridge et al. | 29/840 X |
| 5,848,467 A | 12/1998 | Khandros et al. | 29/840 X |
| 5,994,781 A | 11/1999 | Smith | 257/773 |

* cited by examiner

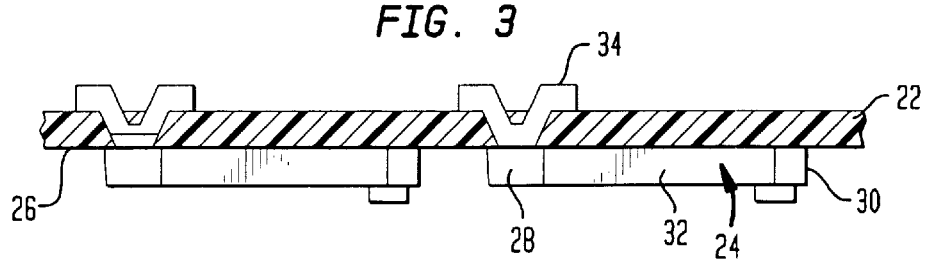
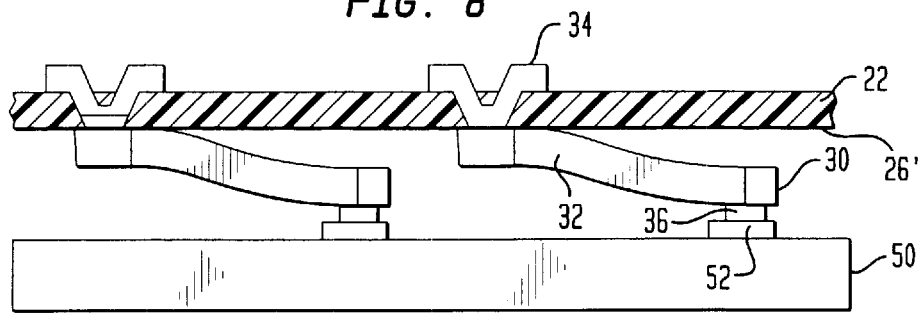
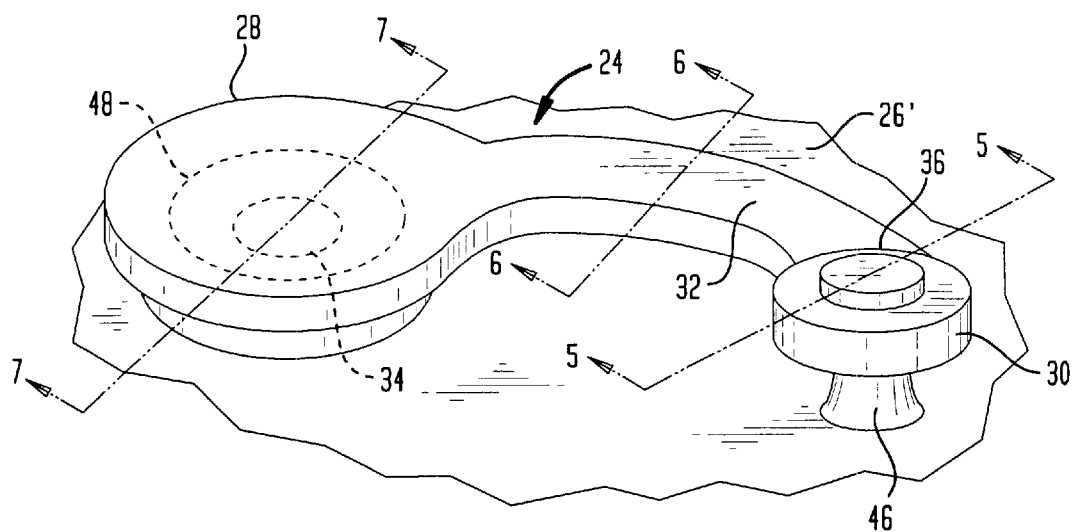
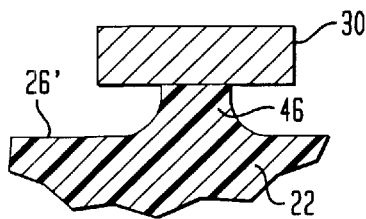 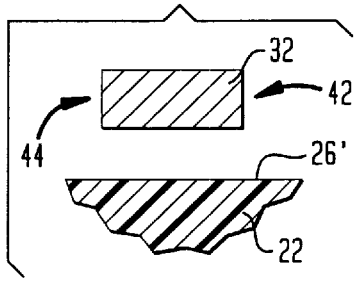 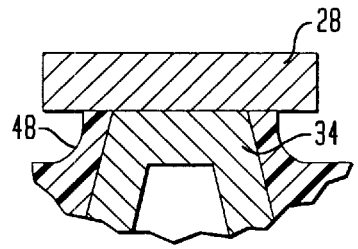

COMPONENTS WITH RELEASABLE LEADS

CROSS-REFERENCE TO RELATED APPLICATIONS

The present application is a continuation of U.S. patent application Ser. No. 09/225,669, filed Jan. 5, 1999, which is a divisional of U.S. patent application Ser. No. 09/020,750, filed Feb. 9, 1998, the disclosures of which are both hereby incorporated by reference herein.

FIELD OF THE INVENTION

The present invention relates to components useful in making electrical connections to microelectronic elements such as semiconductor chips, and to methods of manufacturing such components.

BACKGROUND OF THE INVENTION

Certain techniques for making semiconductor chip assemblies and similar microelectronic assemblies employ releasably attached leads. One such process is disclosed in commonly assigned U.S. Pat. No. 5,518,964, the disclosure of which is hereby incorporated by reference herein. In certain preferred embodiments described in the '964 patent, a first element such as a dielectric layer in a connection component is provided with a plurality of elongated, flexible leads extending along a surface of the element. Each lead has a terminal end permanently attached to the first element and has a tip end offset from the terminal end. The tip ends of the leads may be releasably secured to the first element. A second element such as a semiconductor chip having contacts thereon is engaged with the first element or connection component, and the tip ends of the leads are bonded to contacts on the chip or second element. The elements are then moved away from one another so as to deform the leads and provide vertically extensive leads extending between the first and second elements, i.e., between the chip and the connection component. A compliant material may be introduced between the chip and the connection component.

The resulting structure allows the chip to move relative to the connection component without substantial stresses on the leads, and thus provides compensation for thermal expansion. The preferred structures can be readily tested and can be mounted on a further substrate such as a printed circuit panel or the like. Preferred embodiments of the processes disclosed in the '964 patent can be used with chips or other microelectronic elements having large numbers of terminals. In the preferred processes, many leads can be deformed simultaneously. In particularly preferred processes according to the '964 patent, the leads on a given connection component or first element may be connected to contacts on a plurality of chips such as an array of several chips or numerous chips formed as part of a wafer, so that many leads are deformed simultaneously.

In certain embodiments disclosed in the '964 patent, the tip end of each lead is bonded to the surface of the first element by a small spot of a base metal such as copper interposed between the tip end and the surface. Typically, such a spot is formed by a process in which the leads are formed from an etch-resistant metal such as gold overlying a continuous layer of the base metal. The leads have wide portions at the tip and terminal ends. The component is then subjected to an etching process, as by exposing the component to a liquid etch solution which attacks the base metal so as to undercut the lead and remove the base metal from beneath the etch-resistant metal at all locations except at the terminal end and at the tip end. At the tip end, most, but not all of the base metal is removed from beneath the etch-resistant metal, leaving a very small spot of the base metal. The strength of the bond between the tip and the connection component surface is effectively controlled by the size of the spot. Thus, although the base metal may provide a relatively high bond strength per unit area or per unit length, it may still provide a weak attachment of the tip end of the lead end to the first element surface. Although structures such as frangible lead sections and small buttons can provide useful releasable attachments for the tip ends of the leads, some care is required in fabrication to form these features. Formation of spots of base metal of uniform size beneath the terminal ends of leads on a large connection component requires control of the etching process. Moreover, any variation in the strength of the bond between the base metal and the surface will result in a corresponding variation in the strength with which the tip ends of the leads are held to the surface.

As described in PCT International Publication WO 94/03036, the disclosure of which is hereby also incorporated herein by reference, a connection component may incorporate a support structure such as a polyimide or other dielectric layer with one or more gaps extending through such layer. Preferably, the support structure incorporates one or more flexible or compliant layers. The connection component may further include leads extending across the gap. Each lead has a first or terminal end permanently secured to the support structure on one side of the gap, and a second end releasably attached to the support structure on the opposite side of the gap. In preferred processes as taught by the '036 publication, the connection component is positioned on a semiconductor chip or other microelectronic element. Each lead is engaged by a bonding tool and forced downwardly into the gap, thereby detaching the releasably connected second end from the support structure. The leads are flexed downwardly into the gap and bonded to the contacts on the chip or the microelectronic element. Preferred connection components and processes according to the '036 publication also provide highly efficient bonding processes and very compact assemblies. The finished products provide numerous advantages such as compensation for thermal expansion, ease of testing and a compact configuration.

Other structures disclosed in the '036 publication and in the '964 patent employ frangible lead sections connecting the releasable end of each lead to another structure permanently mounted to the support structure or first element. Frangible sections can also provide useful results. However, such frangible elements are most commonly formed by using the photo-etching or selective deposition processes used to form the lead itself to form a narrow section. The minimum width at the narrow section, can be no less than the smallest width formable in the process. As the other portions of the lead adjacent the narrow section must be wider than the narrow section, these other portions must be larger than the minimum attainable in the process. Stated another way, the leads made by such a process generally are wider than the minimum line width attainable in the formation process. This limits the number of leads which can be accommodated in a given area.

In other embodiments disclosed in the '036 publication, the first or permanently mounted terminal end of a lead may have a relatively large area, whereas the second or releasably mounted end of the lead overlying the support structure may have a relatively small area, so that such second end will break away from the support structure before the first end when the lead is forced downwardly by the bonding tool. This arrangement requires control of the dimensions of the ends to control the area of the bond between the lead end and the support structure and also requires a lead wider than the smallest element formable in the process.

As described in the '036 publication, and as further described in commonly assigned International Publication WO 97/11588, the disclosure of which is also incorporated by reference herein, leads used in these and other microelectronic connection components may include polymeric layers in addition to metallic layers. The polymeric layers structurally reinforce the leads. For example, certain leads described in the '588 publication incorporate a pair of thin conductive layers such as metallic layers overlying opposite surfaces of a polymeric layer. One conductive layer may be used as a signal conductor, whereas the opposite conductive layer may act as a potential reference conductor. The composite lead thus provides a stripline extending along the lead. A stripline lead of this nature can provide a low, well-controlled impedance along the lead, which enhances the speed of operation of the circuit formed by the connection component and the associated microelectronic elements. The potential reference conductor also helps to reduce crosstalk or undesirable inductive signal coupling between adjacent leads.

Despite all of these improvements, still further improvements would be desirable.

SUMMARY OF THE INVENTION

One aspect of the present invention provides methods of making connection components. A method according to this aspect of the invention desirably includes the steps of providing a starting structure including one or more metallic leads overlying a polymeric dielectric layer, and etching portions of the dielectric layer disposed beneath said one or more leads by contacting the starting structure with an etchant, most preferably a gaseous etchant such as a plasma of a reactant gas including oxygen or other oxidizing gas. Typically, in the starting structure the leads overlie a first surface of the dielectric layer. The etching step may be performed by exposing the first surface, with the leads thereon, to the etchant. The etching step most preferably is performed so as to leave only certain parts of the said leads connected to the dielectric layer by etch-defined polymeric connection regions smaller than such parts. Thus, after the etching step, the leads are spaced vertically from the etched surface of the dielectric layer. The connection regions form polymeric connecting elements integral with the dielectric layer and extending vertically between the dielectric layer and the overlying regions of the leads, referred to herein as the attachment regions of the leads.

The polymeric connection regions or connecting elements provide reliable, readily releasable connections between the attachment regions of the leads and the dielectric layer. Regardless of the degree of adhesion between the polymeric layer and the material of the leads, the force required to release a connection cannot exceed the tensile strength of the polymeric connecting element. This is controlled by the cross-sectional area of the polymeric connecting element. This area can be controlled accurately in the etching process.

Each lead may include first and second ends, and an elongated region extending between these ends. The etching step may be performed so as to detach the elongated region from the dielectric layer, and so as to leave one end of the lead releasably connected to the dielectric layer by such a connecting element. The other end of the lead may be left permanently anchored to the dielectric layer. For example, the first ends of the lead and the underlying portion of the polymeric layer may be covered with a mask during the etching process, so that the polymeric layer remains substantially unetched and the first ends remain securely anchored to the polymer layer. The second ends of the leads and the underlying portions of the polymeric layer may be exposed to the etchant so as to remove parts of the polymeric layer and form the polymeric connecting elements beneath the second ends of the leads.

A further aspect of the invention provides a microelectronic connection component comprising a support structure including a polymeric dielectric layer having a surface extending in horizontal directions; one or more metallic conductive structures such as leads overlying said surface of said dielectric layer, the conductive structures having attachment portions vertically spaced from said surface; and polymeric connecting elements integral with said dielectric layer extending between the surface and the attachment portions of said conductive structures. The attachment portions of the leads overly the polymeric connecting elements. Each such connecting element has at least one horizontal dimension smaller than the corresponding horizontal dimension of the attachment portion overlying that connecting element. The connecting elements preferably form releasable connections between the attachment portions of the leads and the support structure. Components according to this aspect of the invention can be fabricated according to the processes discussed above.

A further aspect of the invention provides methods of making microelectronic connection components comprising the steps of: providing a support structure and one or more leads mounted to said support structure; and depositing a dielectric material on the leads. Most preferably, the leads are deformable or movable with respect to the support structure. The depositing step preferably is performed so that the deposited dielectric material provides a continuous jacket extending entirely around the lead over at least a portion of its length. For example, portions of the leads may project from an edge of the support structure or project across gaps in the support structure, and a continuous jacket may be provided in these portions of the lead. The process can provide microscopic leads on connection components with insulating jackets typically provided only on much larger leads such as conventional wires. The depositing step may be performed by means of an electrophoretic deposition bath.

According to a further aspect of the invention, the process may include the additional step of depositing a conductive layer such as a metallic layer over the deposited dielectric. The metallic layer thus forms a reference conductor extending coaxially with the lead but insulated therefrom by the dielectric jacket. In effect, each lead is converted to a miniature coaxial cable.

Yet another aspect of the invention provides microelectronic connection component including a support structure and one or more leads attached to the support structure. Each lead has an elongated section movable with respect to the support structure. A jacket of a dielectric material surrounds each said lead over at least a part of the elongated section of that lead. The component preferably further includes reference conductors surrounding and extending coaxially with the elongated sections of said leads and insulated therefrom by the jackets of dielectric material, the reference conductors including a coating of an electrically conductive material overlying the dielectric jackets. The elongated sections of the leads preferably have cross-sectional dimensions less than about 100µ, and typically about 50µ or less, whereas the dielectric material may be about 12–50 µm thick. The reference conductors may be electrically connected to potential plane elements on the support structures, such as ground or power planes.

The insulated leads provide immunity to accidental short-circuiting during or after connection with the microelectronic component. In the embodiment incorporating the conductive jackets, the leads act as miniature coaxial cables, and provide well-controlled impedance which enhances signal propagation and permits operation at high frequencies. The miniature coaxial cables also provide outstanding immunity to electromagnetic interference such as cross-talk between adjacent leads. In a further variant, each lead and the surrounding conductive may serve as the two conductors of a differential signaling circuit.

BRIEF DESCRIPTION OF THE DRAWINGS

FIG. 3 is a view similar to FIG. 2 but depicting the component in a later stage of the process.

FIG. 4 is a fragmentary, diagrammatic perspective view depicting a portion of the component illustrated in FIG. 3, in a position inverted from that shown in FIG. 3.

FIG. 5 is a fragmentary, diagrammatic sectional view taken along line 5—5 in FIG. 4.

FIG. 6 is a fragmentary, diagrammatic sectional view taken long line 6—6 in FIG. 4.

FIG. 7 is a fragmentary, diagrammatic sectional view taken along line 7—7 in FIG. 4.

FIG. 8 is a view similar to FIG. 2 but depicting the component in during use, in conjunction with a microelectronic element.

DETAILED DESCRIPTION OF THE PREFERRED EMBODIMENTS

Figure 1:
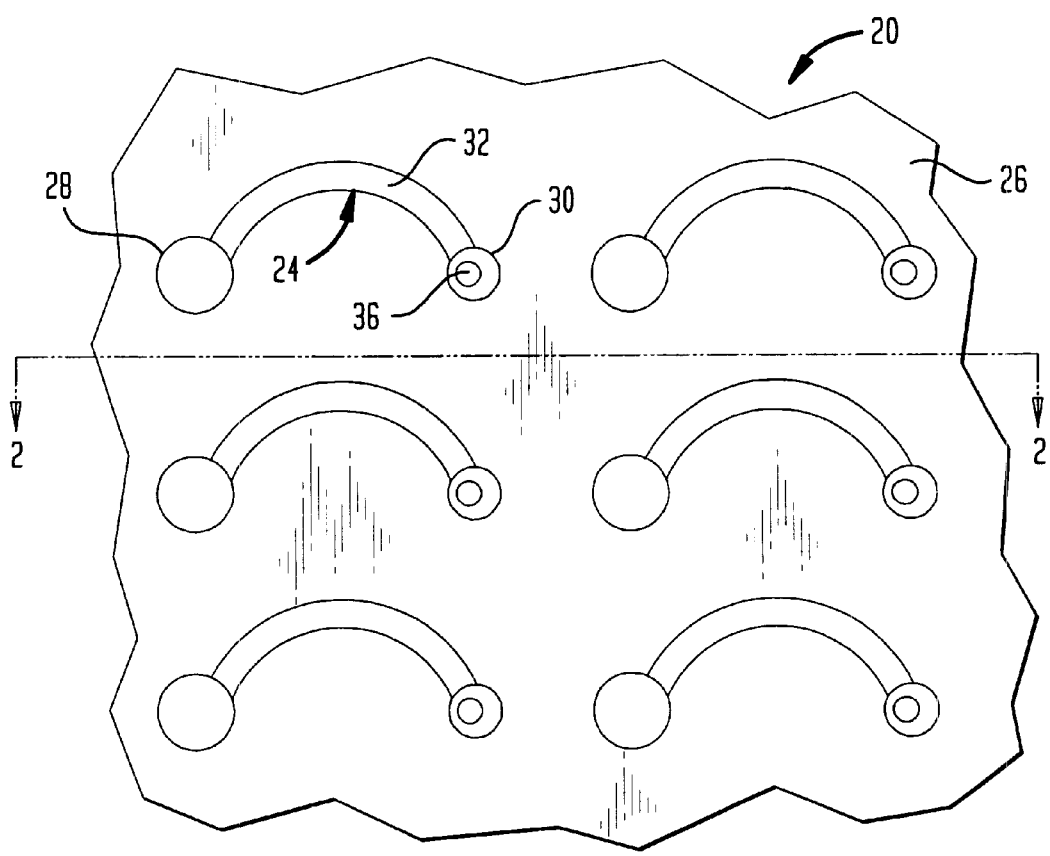
FIG. 1 is a fragmentary elevational view of a connection component in accordance with one embodiment of the invention during a process of manufacturing in accordance with an embodiment of the invention.

A process in accordance with one embodiment of the invention begins with a starting structure 20 incorporating a dielectric layer, preferably a polymeric layer 22 and a plurality of leads 24 overlying a surface 26 of the dielectric layer. Each lead includes a first end 28, a second end 30 and a relatively narrow, elongated section 32 extending between the ends. The first end 28 of each lead is wider than elongated section 32, and the second end 30 of each lead is also wider than the elongated section. Stated another way, the minimum distance across each lead at the ends is greater than the minimum distance across the lead within elongated section 32. The leads adhere to the surface 26 of layer 22. Additionally, the first end 28 of each lead is physically attached to the polymeric layer by a metallic electrical conductor 34 extending into the polymeric layer at the first end.

Figure 2:
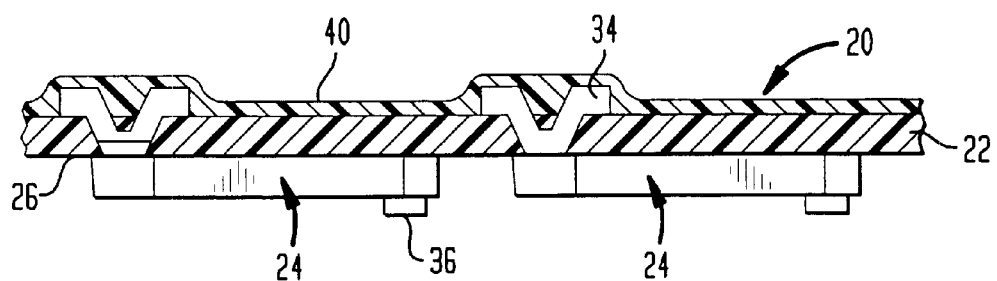
FIG. 2 is a diagrammatic sectional view taken along line 2—2 in FIG. 1.

Dielectric layer 22 may be formed by essentially any polymeric material which can be etched by the etchants discussed below. Many of the common organic polymers normally used to form dielectric layers in electronic connection components are susceptible to gaseous etchants. Polyimide can be etched in this manner and can be used as the material of polymeric layer 22. In the particular embodiment depicted in FIGS. 1 and 2, polymeric layer 22 is provided as a single layer forming the entirety of a supporting structure, and conductors 34 are vias extending entirely through that single layer structure. However, polymeric layer 22 can be provided as part of a larger support structure. For example, the polymeric layer may form one surface layer on a complex, multilayer support structure incorporating numerous dielectric layers, electrically conductive potential plane layers and layers of internal electrical conductors. Electrical conductors 34 need not extend entirely through the support structure. For example, the electrical conductors 34 may extend into the interior of a complex support structure, and may terminate at one or more of the internal conductors and/or potential plane elements of such a complex structure.

The starting structure may be fabricated by essentially any conventional process. For example, leads 24 may be formed by additive plating on polymeric layer 22 or by subtractive etching of a preexisting metal layer in contact with the polymeric layer. Conductors 34 may be formed by conventional plating processes for forming the liners in polymeric layers. The processes used to form the leads desirably provide the leads with good adhesion to the polymeric layer. For example, where the leads are formed by additive plating, an initial layer of metal may be deposited onto the polymeric layer by a high-energy deposition process such as sputtering, and the leads may be additively plated onto the initial layer. A metal layer may be laminated to the polymeric layer using conventional adhesives (not shown) and the metal layer may be subtractively etched to form the leads. The metal in leads 24 may be essentially any electrically conductive metal usable as an electrical lead. For example, copper, gold and alloys containing these metals may be employed. Moreover, leads 24 may include plural layers of different metals. For example, leads 24 formed from copper or copper alloy and may be covered by a thin layer of gold. The particular leads illustrated in FIGS. 1 and 2 incorporate spots 36 of a bonding material at the second end of each lead. Bonding material 36 is adapted to bond the second ends of the leads to contacts on a microelectronic component as discussed below. The dimensions and configurations of the leads may be generally as described in the aforementioned '964 patent.

The first surface 26 bearing leads 24 is exposed to an etchant which reacts with the polymer of layer 22 and erodes the polymer layer. Most preferably, the etchant is a gaseous etchant which reacts with the polymer to form gaseous byproducts. The gaseous etchant desirably is a plasma of an oxidizing reactant gas mixture incorporating one or more oxidizing moieties such as a halogen, oxygen or mixtures of halogens and oxygen. Such a plasma contains the oxidizing moieties in a highly activated state as, for example, as ions, radicals, molecules and atoms with electrons in high-energy, unstable or metastable states. For example, in an oxygen-containing plasma, oxygen commonly is present as monatomic oxygen (O) and ozone ($O_3$). These species are formed more reactive than the normal, stable, diatomic form of oxygen ($O_2$). As used in this disclosure with reference to a constituent of a gaseous etchant, the term "activated species" should be understood as referring to any species of the constituent which is more reactive than the normal, stable form of such constituent. A plasma may be provided at first surface 26 by means of a conventional plasma treatment apparatus. Such apparatus typically includes a chamber connected to a supply of the plasma-forming reactant gas mixture. Electrodes may be provided within the chamber for applying electrical energy directly to the gas mixture in the chamber. Alternatively or additionally, a coil or other suitable antenna may be disposed outside of the chamber for applying radio frequency electrical energy through the wall of the chamber. The chamber is provided with exhaust pumps for maintaining the interior of the chamber under subatmospheric pressure and with conventional pressure-regulating and energy-regulating devices. The electrical energy applied to the gas mixture within the chamber produces an electrical discharge and thus ionizes the gas mixture to form the plasma. In a so-called direct plasma process, the plasma is directly in contact with the polymeric layer. In a indirect plasma process, the plasma is formed in a plasma region of the chamber remote from the structure to be treated. The gas flow within the chamber is arranged so that the gas flows through the plasma region and from the plasma region towards the structure being treated. This arrangement can be used, for example, where the particular activated species formed in the plasma have an appreciable "half-life" and hence can survive in the flowing gas until they reach the structure being treated. In the indirect plasma treatment, the structure is exposed to a mixture of activated species left after passage of the gas through the plasma, commonly referred to as a "afterglow", rather than to the plasma itself. Both direct and indirect plasma treatments are well-known in the art of plasma treatment and hence need not be further described herein.

During exposure to the gaseous etchant, the surface of structure 22 opposite from surface 26 may be protected by a temporary mask layer 40. Mask layer may be a layer such as an adhesive-backed polymeric masking layer or an adhesive-bearing metallic layer such as a copper foil. As the gaseous etchant contacts surface 26, it reacts with the material of the polymer layer at such surface and converts the same to gaseous byproducts which are swept from the chamber with the used reactant gas. The gaseous etchant does not appreciably attack the metal in the leads. The gaseous etchant attacks those portions of the exposed surface 26 which are not covered by the leads and also attacks those portions of the polymeric layer surface beneath the leads, beginning at the edges of the leads. The etching process is generally isotropic. That is, the etched front advances at substantially equal rates in horizontal and vertical directions from the edges of the leads. Thus, surface 26 recedes in the areas which are not covered by the leads and in the areas adjacent the edges of the leads. As the process progresses, the surface of polymer layer 22 is etched from beneath leads 24, starting at the edges of the leads.

The etching step is terminated when it has reached the stage depicted in FIGS. 3–7. At this stage of the process, etched regions advancing from opposite edges 42 and 44 of the narrow, elongated sections 32 have met one another and joined with one another, so that the elongated sections 32 of the leads are entirely detached from the etched surface 26' of the polymer layer 22. However, at the somewhat wider, second ends 30, the advancing etch fronts have not yet met one another. Thus, a small polymeric region 46 remains beneath each second end 30. Each such region 46 forms a connecting element which is smaller than the associated second end region 30 of the lead. Each such connecting element extends from the newly etched polymer surface 26' to the lead, so that the second end 30 remains attached to the polymer layer, but vertically spaced from the polymer layer. The first end 28 of each lead remains attached to the polymer layer by the electrically conductive via 34. Depending upon the dimensions of the polymer layer and the dimensions of the via, a polymeric anchor connecting element 48 may also remain at the first end 28 of each lead.

When the etching process reaches the stage illustrated in FIGS. 3–7, the component is ready for use. Because the etching step does not leave any residue on the component, and does not utilize liquid which must be rinsed from the component, no further processing steps are required to clean residues or etching solutions from the component. Indeed, the etching step actually cleans organic contaminants from the metallic leads. The temporary masking layer 40 may be removed after the etching process, as by peeling it away. Alternatively, masking layer 40 may be omitted if the polymeric layer is placed in the plasma chamber in such a fashion that only the first surface 26 is exposed to the gaseous etchant. For example, the opposite surface of the polymeric layer may lie against a support, or may be covered by a protective blanket of an inert gas admitted during the process so that the inert gas flows over the opposite surface and protects it from attack by the gaseous etchant.

The finished components, as illustrated in FIGS. 3–7, include leads having first ends or anchor portions 28 permanently attached to the polymeric layer 22. The second end or attachment portion 30 of each lead is releasably connected to the polymeric layer by a polymeric connecting element 46. Thus, connecting elements have only limited strength because it has a relatively small area. The strength of the connection between each attachment section or second end 30 and the polymeric layer 22 cannot exceed the tensile strength of the associated connecting element 46. That tensile strength in turn is directly proportional to the cross-sectional area of the connecting element. Such cross-sectional area depends upon the dimensions of the second end 30, the rate of etching and the etching time. All of these factors can be controlled readily and repeatedly on a large scale.

The particular component discussed above with reference to FIGS. 1–7 is used in a process as described in the aforementioned '964 patent. As discussed in greater detail therein, the connection component is juxtaposed with a microelectronic chip, wafer or other microelectronic element 50 (FIG. 8), so that the releasably connected second ends 30 of the leads are aligned with contacts 52 on the microelectronic element. Heat and pressure are applied to bond the second ends 30 of the leads to the contacts 52 using the bonding material 36 carried by the leads. During this process, the second ends of the leads remain attached to the polymeric layer by the connecting elements 46. After the second ends have been bonded to the contacts, the polymeric layer 22 and microelectronic element 50 are moved away from one another through a predetermined displacement so as to deform the elongated sections 32 of the leads to a vertically extensive disposition. As the microelectronic element and dielectric layer move away from one another, the second ends of the leads move away from the surface 26'. The connecting elements 46 either break or pull away from the surface of the metal leads. However, because the strength of each connecting element is well controlled, the second ends of the leads will release reliably from the polymeric layer. As further discussed in the '964 patent, a compliant material such as a gel or elastomer may be provided around the deformed leads, as by introducing a liquid encapsulant between the polymeric layer and the dielectric element and curing the liquid encapsulant. The vertically extensive, bent leads provide flexible interconnections between the chip contacts 52 and the electrical conductors 34 on the polymeric element.

In a process according to a further embodiment of the invention, leads with elongated regions 132 and attachment regions or end regions 130 are provided on a surface 126 of a polymeric layer 122. A mask 140 covers a first region of the dielectric surface and covers those portions 133 of the leads exposed in this region. Mask 140 itself is susceptible to attack by the gaseous etchant. The etching step is performed as discussed above. In those regions of the surface which are not covered by mask 140, surface 126 is attacked, leaving elongated portions 132 detached from the newly etched surface 126', and leaving end regions or attachment regions 130 connected to the newly etched surface 126' by polymeric connecting elements 146 similar to those discussed above. In the region of the polymeric layer initially covered by the mask, surface 126 remains substantially unetched and hence lead portions 133 remain securely anchored to the unetched surface of layer 122. The mask is removed by the etching process itself; the etching step is terminated shortly after the mask is eroded away by the etchant. Alternatively, mask 140 may be resistant to the etchant, and may be physically peeled away after the etching step. For example, mask 140 may include a metallic layer such as a layer of copper together with an adhesive.

Figure 11:
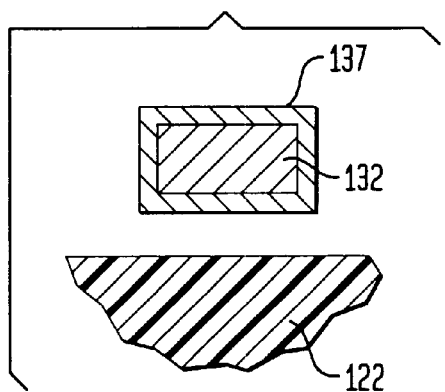
FIG. 11 is a sectional view taken along line 11—11 in FIG. 10.

The etching process forms a vertically-extensive step 127 in the surface of the polymeric layer at the juncture of the masked and unmasked portions. Each elongated portion 132 projecting over the etched region is spaced above the etched surface 126' of the polymeric layer. The leads may be plated after etching. For example, where the leads 132 are formed from a metal such as copper, a more fatigue-resistant, more bondable metal such as gold may be applied as a layer 137 around the leads. At least in those regionsof the leads which are spaced from the polymeric surface, the plating layer 137 may form a continuous jacket around the entire lead, as seen in FIG. 11. The plating protects the leads from corrosion and fatigue and also provides a lower-impedance composite lead. The effect on lead impedance is particularly significant in the case of high-frequency signals, which tend to propagate along the surfaces of the leads.

Figure 12:
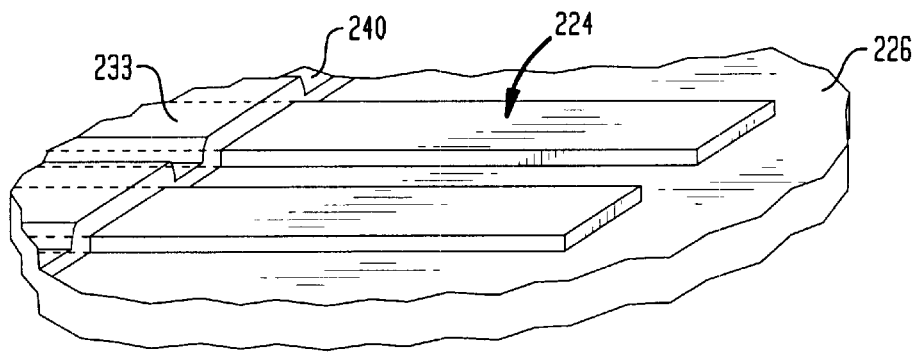
FIG. 12 is a fragmentary diagrammatic perspective view depicting a component in a process according to yet another embodiment of the invention.

In a process according to a further embodiment of the invention, the leads 224 (FIG. 12) are of substantially uniform width. Here again, a first region of the surface 226 and the corresponding anchor portions 233 of the leads are covered by a mask 240. After etching, the exposed portions of leads 224 are connected to the etched polymeric surface 226' by polymeric connection elements 246 in the form of strips narrower than the leads. The mask-covered anchor regions 233 remain attached to the original surface 226 over substantially the full widths of the leads. Thus, the anchor regions at the first ends of the leads remain permanently attached whereas the exposed portions 230 at the second ends of the leads are releasably attached to the polymer layer by the narrow connecting elements 246. In a further step, a slot 255 is cut through the polymer layer 222 beneath the leads, between the anchor regions 233 and the ends of the exposed or releasably attached regions 230. Such a slot may be formed, for example, by a further etching step from the opposite surface of the polymer layer, or by laser ablation of the polymer layer. Processes according to this aspect of the invention may be used to make connection components for use in processes as illustrated in the aforementioned 94/03036 International Publication. As described in greater detail in that publication, the connection component can be used in a process wherein a bonding tool is advanced through the slot 255 and engaged with each lead so as to break the lead away from the dielectric layer. During the process, the polymeric connecting element 246 associated with each lead is broken as that lead is engaged by the bonding tool and pushed away from the dielectric supporting layer.

Figure 9:
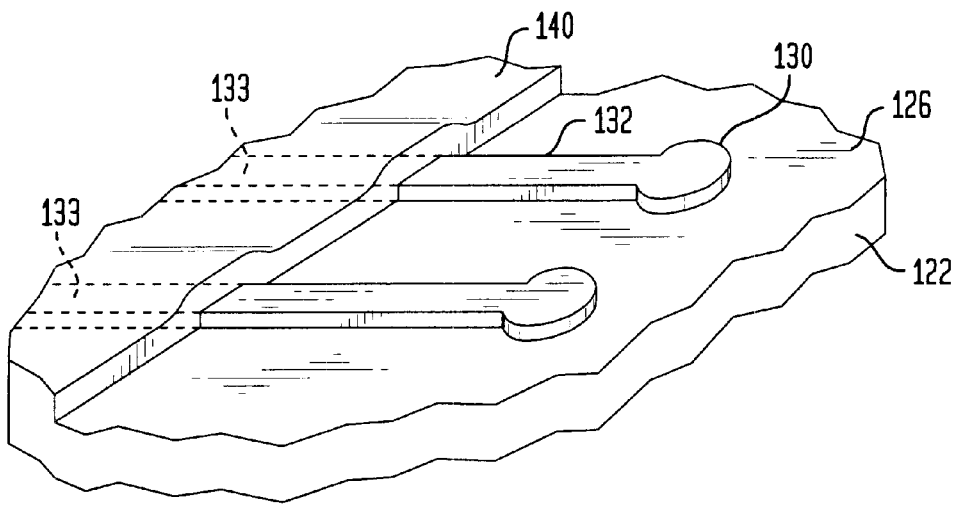
FIG. 9 is a fragmentary diagrammatic perspective view depicting a component in a process according to a further embodiment of the invention.
Figure 10:
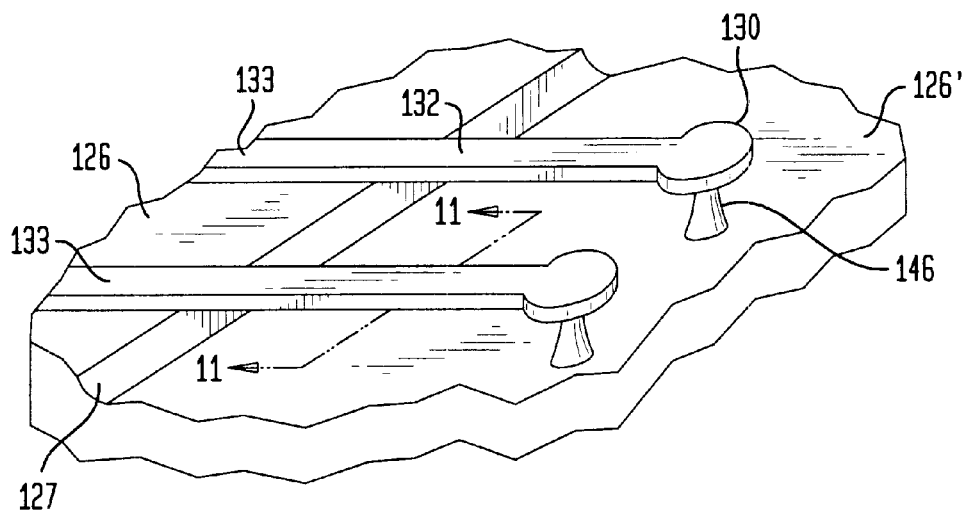
FIG. 10 is a view similar to FIG. 9 but depicting the component during a later stage of the process.
Figure 15:
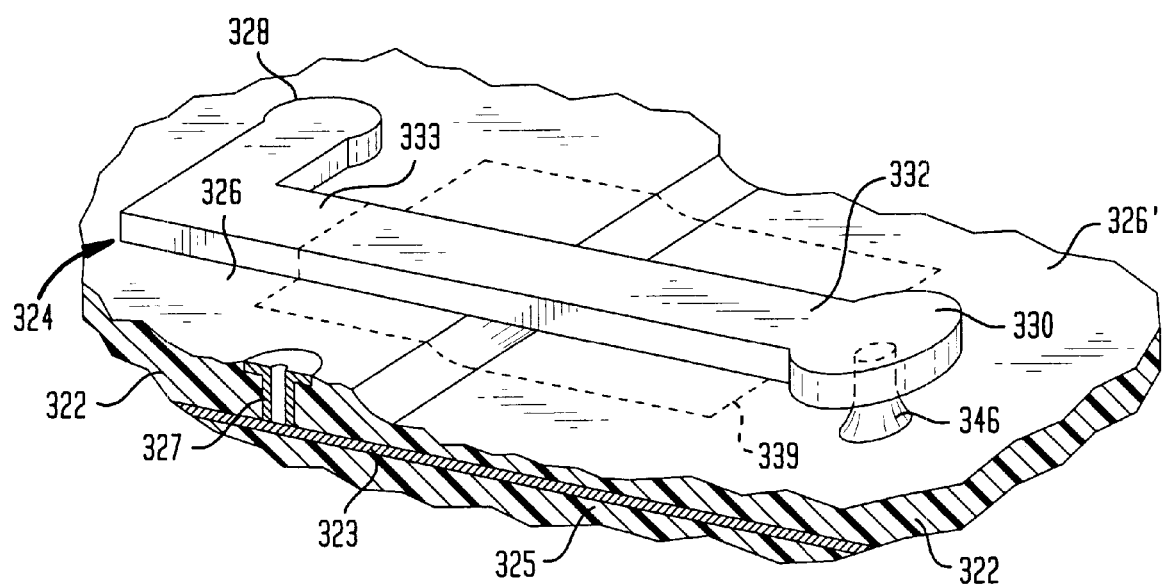
FIG. 15 is a fragmentary diagrammatic perspective view depicting a component in a process according still another embodiment of the invention.

A method according to a further embodiment of the invention utilizes a starting structure incorporating a support substrate having a top polymeric layer 322 and an electrically conductive potential plane or ground plane layer 323 remote from the exposed surface 326 of the top dielectric layer. The starting structure also includes a further dielectric layer 325 on the rear or bottom side of potential plane layer 323. Vias with conductive via liners 327 extend from the potential plane layer to the exposed surface 326 of the top dielectric layer 322. Numerous leads 324, of which only one is shown in FIG. 15, are provided on the exposed surface 326. Here again, each lead includes a first end 328, a second end 330 and an elongated, narrow section 332 extending between the first and second ends. Using process steps similar to those discussed above with reference to FIGS. 9 and 10, the exposed surface 326 of the top dielectric layer is etched while a portion of the top surface is covered by a mask (not shown). This leaves the structure in the configuration depicted in FIG. 15, wherein an anchor section 333 of each lead adjacent the first end therein remains fully attached to the unetched surface 326, the second end 330 is connected to the etched surface 326' of dielectric layer 322 only by a relatively narrow, frangible connecting element 346 formed during the etching process and a part of the elongated section 332 adjacent second end 330 is detached from the newly-etched surface 326' of the polymeric layer 322.

Figure 17:
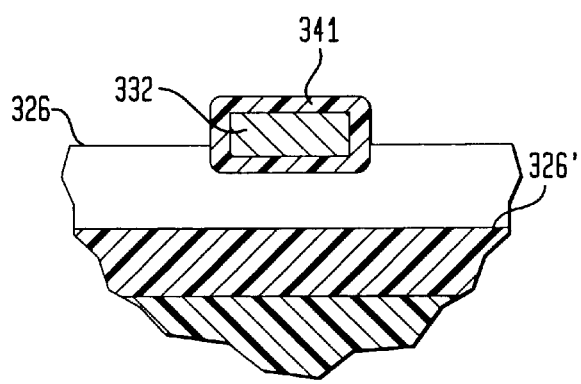
FIG. 17 is a fragmentary sectional view taken along line 17—17 in FIG. 16.

After the etching step, a mask is applied over the assembly. The mask has an opening delineated by broken lines 339 in FIG. 15. The opening in the mask encompasses most of elongated section 332, but stops short of the second end 330. In the next stage of the process, a conformal coating 341 of a dielectric material is applied on those portions of leads 324 disposed within the opening 339 of the mask. As depicted in FIG. 17, the conformal coating forms a continuous dielectric jacket surrounding elongated lead portions 332. Some of the conformal coating also extends over a part of lead anchor regions 333 and merges with the unetched surface 326 of the dielectric top layer 322. The thickness of coating 341 is exaggerated in the drawings for clarity of illustration. In practice, the conformal coating desirably is about 0.0005 inches to about 0.002 inches thick, i.e., about 12–50 $\mu$m thick. Thinner conformal coatings can be employed. Also, the cross-sectional dimensions of the leads are exaggerated in the drawings. The elongated sections of the leads desirably have cross-sectional dimensions less than about 100 microns. For example, the elongated sections of the leads may be about 5–15 $\mu$m thick and about 15–50 $\mu$m wide.

The conformal coating may be applied by electrophoretic deposition. In the electrophoretic deposition process, leads 324 are connected to a source of an electrical potential and immersed in a bath of a liquid deposition mixture. A counter-electrode is also immersed in the deposition mixture. The potential applied by the source causes the solid material from the deposition mixture to deposit onto the surfaces of the leads where the surfaces are not covered by the mask. To facilitate application of electrical potential to the leads, the leads may be continuous with a bus (not shown) which is subsequently removed from the part. Electrophoretic deposition processes and materials for use in deposition mixtures are well-known in the coating art. For example, materials for applying an acrylic polymer are sold under the designation Powercron cationic acrylic (700–900 series) by the PPG Company. Materials for applying epoxy coatings are sold under the designation Powercron cationic epoxy (400–600 series) by the same vendor. The counter-electrode desirably is considerably larger than the leads. The current density during the electrophoretic deposition step preferably is maintained below about 1 milliampere per square centimeter of exposed lead surface so as to minimize bubble formation in the deposited coating. The current may be maintained substantially constant during the deposition process. The potential applied may be about 100 volts. The process typically takes a few minutes. After the electrophoretic deposition step, the part is removed from the bath, washed to remove clinging, undeposited deposition solution and then baked to cure the coating to a solid form.

Other processes for depositing the dielectric coating may be employed as, for example, dipping or spraying in a curable coating material such as an epoxy, urethane, lacquer, or plastisol to form an adherent liquid film and then curing the liquid film to form the solid dielectric. Vapor deposition processes and plasma polymerization processes may also be employed. The coating process which is used should be capable of depositing a thin coating on the unmasked area of the leads. It is desirable to apply the coating in as close to a uniform thickness as practicable.

Figure 16:
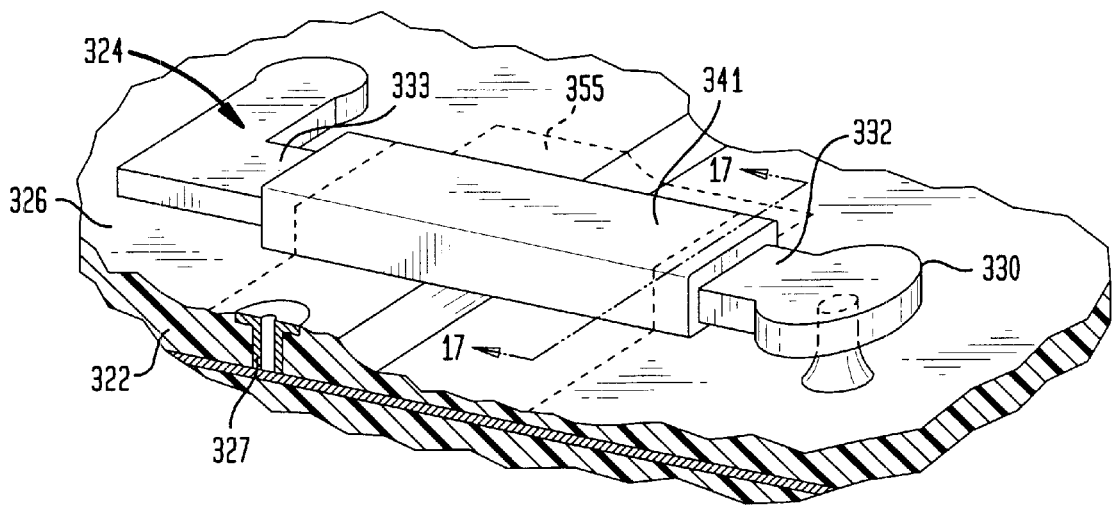
FIG. 16 is a view similar to FIG. 15 but depicting the component of FIG. 15 in a later stage of the process.

After the dielectric coating is applied, the mask used during application of the dielectric coating is removed and a further mask is applied. The additional mask covers the component and the leads except that in the area denoted by broken lines 355 in FIG. 16. Thus, the additional mask has an opening slightly shorter than opening of the mask used for deposition of the dielectric coating in the lengthwise direction along the elongated portions of the leads, so that the edges of the additional mask opening fall within the portion of the lead covered by dielectric coating 341. The opening in the additional mask also extends to via liner 327. A continuous layer of an electrically conductive material, preferably a metal such as copper or gold, is applied within the opening of the additional mask so as to form a metallic coating 357 surrounding the dielectric layer 341 and the elongated portion 332 of each lead. Metal layer 357 has additional portions 359 extending into electrical contact with via liner 327, so that the metal layer is electrically connected to the internal ground plane 323 of the supporting structure. The metal layers may be formed by conventional metal deposition processes such as electroless plating or vapor deposition to deposit an initial, very thin film of metal, followed by electroplating to build up the metal to the final thickness desired. Because the metal coatings on all of the leads are electrically continuous with the ground plane 323, electroplating can be performed by applying the necessary plating potential to the ground plane after deposition of the initial metal layer. Preferably, the metal layer is less than about 25 $\mu$thick, and most preferably about 12 $\mu$m thick or less.

Figure 18:
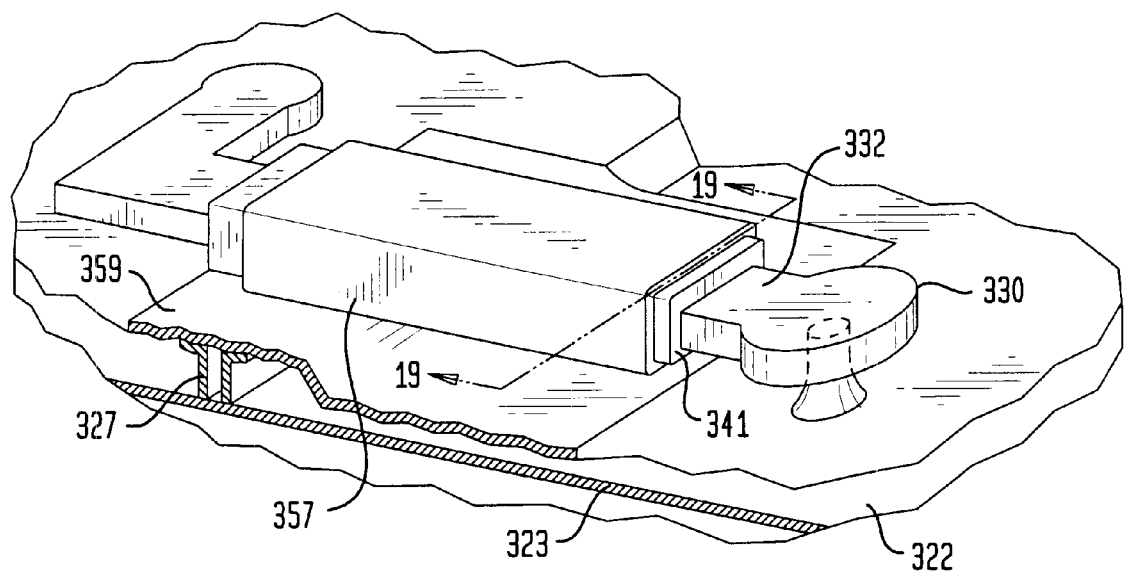
FIG. 18 is a view similar to FIG. 15 but depicting the component of FIGS. 15–17 in a later stage of the process.
Figure 19:
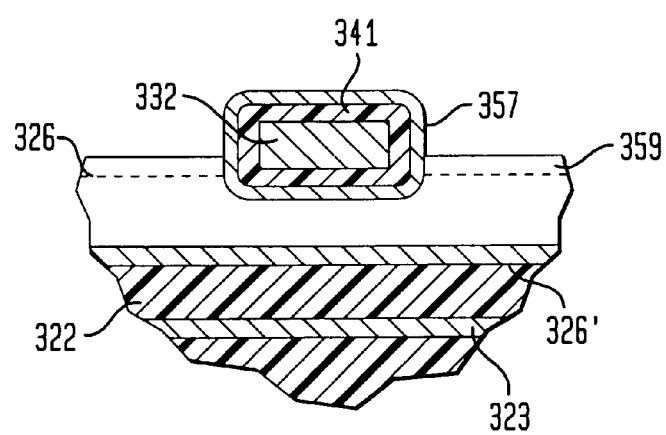
FIG. 19 is a fragmentary sectional view taken along line 19—19 in FIG. 18.

The finished leads, as depicted in FIGS. 18 and 19, can be employed in the same manner as the leads discussed above. Thus, the releasable second end 330 of each lead may be connected to a supporting substrate or other microelectronic component and may be bent away from dielectric layer 322 and the remainder of the support structure. The elongated portion 332 of each lead remains flexible. However, the elongated portion of each lead is surrounded, over at least a part of its length, by dielectric layer 341 and by conductive layer 357, which is connected to a constant potential on ground plane 323. This provides a controlled impedance along the length of the lead. Moreover, the metallic shield coaxially surrounding each lead effectively blocks radiation of electromagnetic fields from or to the lead. This substantially reduces or eliminates cross-talk between adjacent leads and coupling of electromagnetic interference to the leads. Moreover, the polymeric layer and metallic layer mechanically reinforce each lead and reduce its susceptibility to fatigue failure. The metal used in the outer layer or jacket 357 desirably has high fatigue resistance Gold or alloys commonly referred to as shape memory alloys, also known as "pseudoelastic alloys" or "superelastic alloys" may be employed. Such alloys include Nitinol™ an alloy including nickel and titanium, and also include certain alloys of thallium and indium, as well as copper-aluminum-nickel alloys.

The metallic and dielectric jackets discussed above can be applied to leads having many different configurations. For example, one form of connection component depicted in International Publication WO 94/03036 includes a dielectric support 422 having a gap 425 therein and plurality of elongated leads 424 projecting from the support across the gap. Each lead has a first end 428 extending along the top or first surface of the dielectric support 422 and permanently attached to the dielectric support on one side of the gap. Each lead also has a second end 430 releasably connected to a metallic bus 431 by a frangible section 433, and hence releasably attached to the dielectric support 422. Typical leads of this type have cross-sectional dimensions (width and thickness transverse to the direction of elongation of the leads) 50 microns wide or less, and commonly about 30 microns wide or less. As discussed in greater detail in the '036 publication, these leads can be connected to a semiconductor chip or microelectronic element by engaging each lead 424 with a bonding tool and forcing the lead downwardly, into gap 425 so as to break the frangible section 433 and detach the second end of the lead. The lead is thus bent downwardly and bonded to a contact (not shown) on the microelectronic element. A dielectric layer 441 and a conductive layer or jacket 457 similar to those discussed above with reference to FIGS. 16–19 may be applied around part of each lead 424. The metallic jackets 457 of the various leads may be contiguous with a metallic layer 459 extending downwardly along the edge of the gap and joining with a ground plane 423 on the bottom surface of the dielectric element. These leads may be formed by masking and deposition processes similar to those discussed above.

Figure 21:
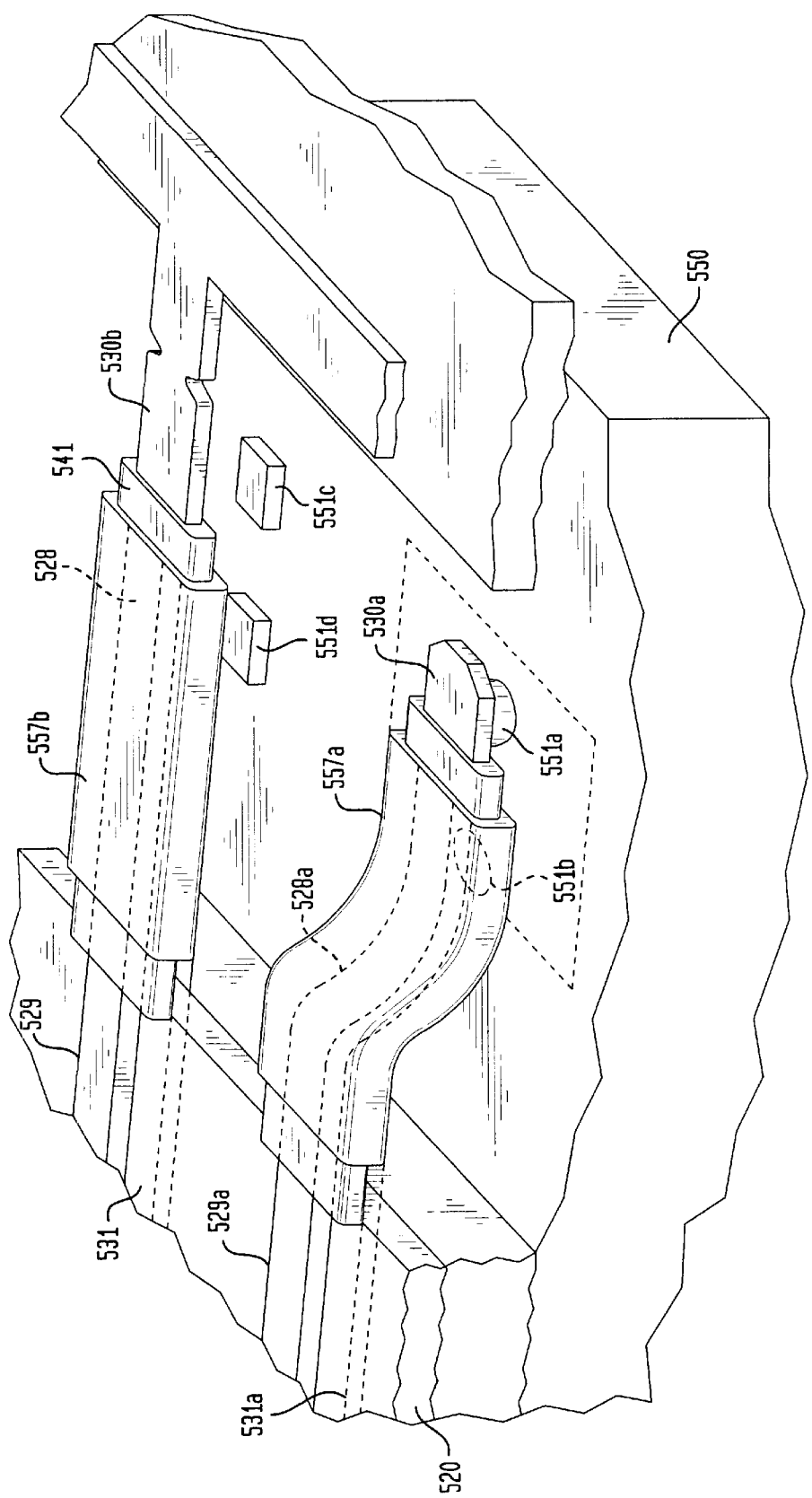
FIG. 21 is a view similar to FIG. 20, but depicting a component in accordance with a further embodiment of the invention, in conjunction with a semiconductor chip.

The connection component depicted in FIG. 21 incorporates leads having a dielectric jackets 541 and conductive jackets 557. The conductive jacket of each lead surrounds the elongated portion 528 of such lead along at least a part of its length. Leads 528 merge with traces 529 on the dielectric element 520. The conductive jackets 557 of at least some of the leads are not connected to a common ground plane, but instead are connected to additional traces 531 on the dielectric element. The connection component can be used with a microelectronic element such as a semiconductor chip 550 having contacts 551 disposed in pairs. When the tip end 530 of the lead is connected to one contact of a pair, the conductive jacket 557 is connected to the other contact of the pair. For example, lead tip end 530a is connected to contact 551a, whereas the conductive jacket 557a of the same lead is connected to contact 551b of the same contact pair. As depicted in FIG. 21, lead tip end 530b and the associated conductive jacket 557b have not yet been connected to the microelectronic element. These parts will be connected to contacts 551c and 551d. To facilitate connection of the jacket, the contact associated with the lead tip end (the contact which does not engage the jacket), such as contact 551a, may project upwardly from the top surface of the microelectronic element. For example, such a contact can be provided with a solder ball of other mass of electrically conductive material. Also, the conductive jackets may be formed from a readily bondable material or overplated with a bondable material in the region of the jacket adjacent the tip end of the lead. For example, materials such as solders, eutectic bonding alloys, conductive polymer compositions and gold can be used. Similarly, the contacts which engage the conductive jackets may be provided with bonding material adapted to bond readily with the material of the jacket. Thus, contacts 551a and 551b may be provided with different bonding materials or with the same bonding material, depending upon the composition of the lead itself and the composition of the conductive jacket. The bonding materials may be heat-actuated, so that the conductive jackets can be bonded to the associated contacts without the need to apply sonic or other vibrational energy through the lead and through the polymeric jackets.

The connected conductive jackets serve to connect contacts on the microelectronic element with traces on the dielectric element. Thus, conductive jacket 557a electrically connects contact 551b and trace 531a. These conductive paths extend in parallel with the conductive paths provided by the leads themselves.

Figure 22:
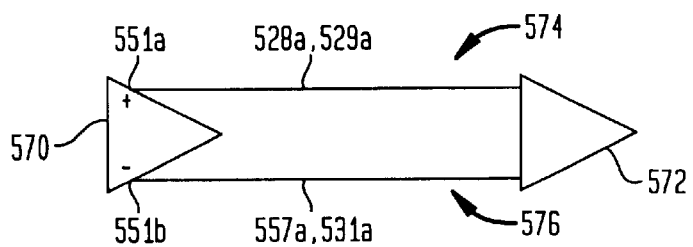
FIG. 22 is a schematic electrical diagram depicting an electrical circuit in the embodiment of FIG. 21.

The parallel conductive paths provided by the jackets can be employed in a differential-signal arrangement. As schematically indicated in FIG. 22, a device, such as a device 570 may be arranged to send signals to a second device 572 through two conductors 574 and 576 extending alongside of one another. Device 570 is arranged to transmit signals by varying the difference in potential applied to the two conductive paths, most preferably by applying equal but opposite-sense signals to the two conductive paths. For example, device 570 may extend a first digital output state by applying a relatively high voltage along path 574 and a low voltage along path 576, and may signal the opposite digital output state by applying a high voltage on path 576 and a low voltage on path 574. Stated another way, device 570 sends one signal on path 574 and sends an inverted version of the same signal on path 576. Device 572 subtracts the two signals supplied on paths 574 and 576 to derive an input signal.

Preferably, the connections are arranged so that the two paths used in each differential connection include a lead and the conductive jacket associated with that lead. For example, path 574 shown in FIG. 22 may include contact 551a, lead 528a and trace 529a, whereas the other path 576 used in the same differential connection incorporates contact 551b, jacket 557a which surrounds lead 528a and trace 531a which extends adjacent to trace 529a on the dielectric element. In this arrangement, the two paths constituting each differential connection extend alongside one another throughout the entire route starting with the contacts 551 of the microelectronic element. This arrangement provides substantial immunity to electromagnetic interference. Use of leads which provide dual conductive paths in a differential connection is discussed in greater detail in the co-pending, commonly assigned U.S. Patent Application of Joseph Fjelstad and John W. Smith entitled, Microelectronic Lead Structures With Plural Conductors, filed on even date herewith, the disclosure of which is hereby incorporated by reference herein. Also, the various leads described herein may be used as connecting leads in a chip wherein internal signals are routed from one place in the chip to another place in the chip through an external connecting element. Structures of this type are described in the aforementioned application of Joseph Fjelstad and John W. Smith filed on even date herewith, and are also described in co-pending, commonly assigned U.S. Provisional Patent Applications 60/042,187, filed Apr. 2, 1997 and 60/063,954, filed Oct. 31, 1997, the disclosures of which are hereby incorporated by reference herein.

In yet another variant, some or all of the conductive jackets may be connected between a potential plane such as a ground or power plane on the support structure and corresponding contacts on the chip, such as ground or power input contacts. In a still further variant, each lead may be provided with a plurality of conductive jackets and a plurality of dielectric jackets, so that a first dielectric jacket is disposed between the lead and an inner conductive jacket whereas a second dielectric jacket is disposed between the inner conductive jacket and an outer conductive jacket. The various conductive jackets can be used as signal carrying conductors or as constant potential conductors as discussed above.

Figure 13:
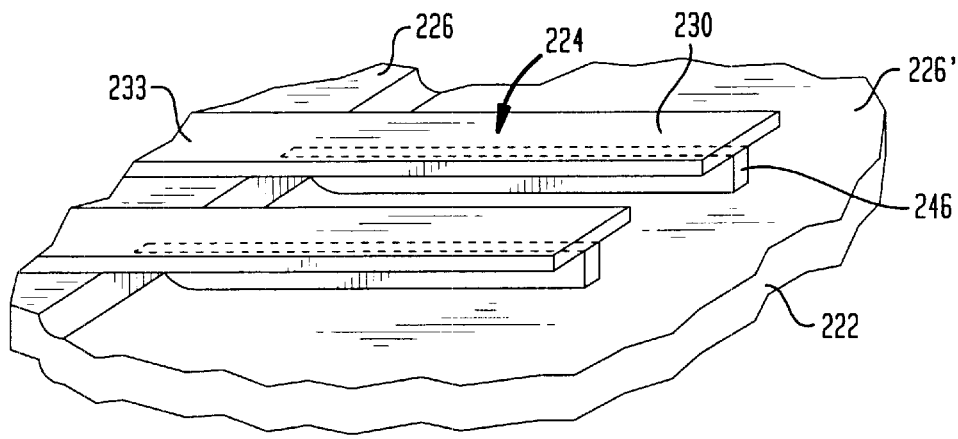
FIGS. 13 and 14 are views similar to FIG. 12 but depicting the component of FIG. 12 in later stages of the process.
Figure 14:
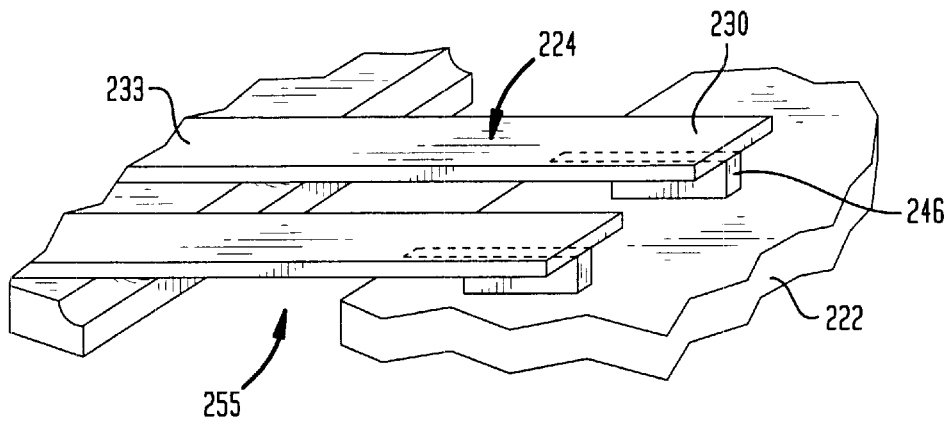

In a process according to yet another embodiment of the invention, leads 624 (FIG. 23) have elongated sections 632 of substantially uniform width, each such elongated section being connected to an anchor region 628. Here again, the anchor regions of the leads may be electrically connected to other electrically conductive structures on dielectric element 620 by conductive elements 629 extending to the anchor regions. Here again, the dielectric layer 620 is exposed to an etchant which removes a polymeric material of the dielectric layer. As discussed above in connection with FIGS. 12–14, this leaves an elongated, web-like polymeric connecting element 646 extending along the length of elongated section 632 of the lead, as well as a further polymeric connecting element 647 underlying the anchor region 628. Thus, the web-like connecting element 646 extends from the anchor region almost to the tip end 630 of the lead. The web-like connecting element is narrower than the elongated section of the lead. It extends vertically between the etched surface and the underside of the lead.

Figure 24:
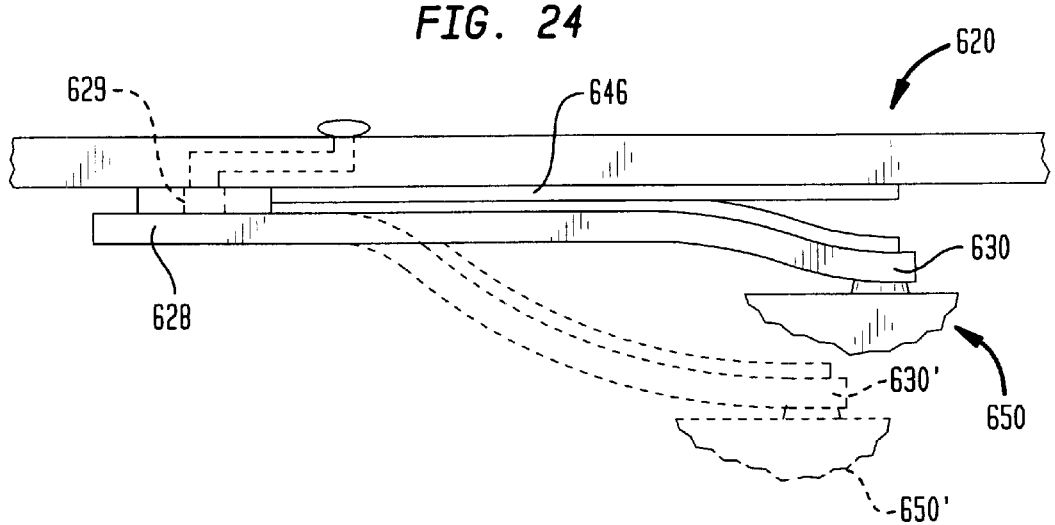
FIG. 24 is a diagrammatic elevational view of the component depicted in FIG. 23, together with a microelectronic element during successive stages of a process in accordance with yet another embodiment of the invention.

In use, the tip end 630 may be bonded to a contact on a microelectronic element 650. As the microelectronic element and polymeric layer are pulled away from one another, the connecting element 646 separates progressively along its length and along the length of the lead, so that the lead progressively peels away from the polymeric layer as the microelectronic element 650 and tip end 630 move through the position shown in solid lines in FIG. 24 to the position illustrated in broken lines at 630', 650'. Separation of the polymeric connecting element may occur by tearing of the polymeric web-like connecting element itself, as depicted in FIG. 24, leaving a part of the polymeric connecting element with the lead and a part with the polymeric layer. Alternatively, the polymer may break at the juncture of the connecting element and the polymeric layer, so that the entire connecting element remains with the lead. More commonly, the polymeric connecting element will peel away from the metallic lead, so the entire connecting element remains with the polymeric layer. Various forms of these release mechanisms may occur at different locations along the length of a single lead. Whichever release mechanism occurs, however, the lead will be peeled progressively away from the polymeric layer.

Figure 23:
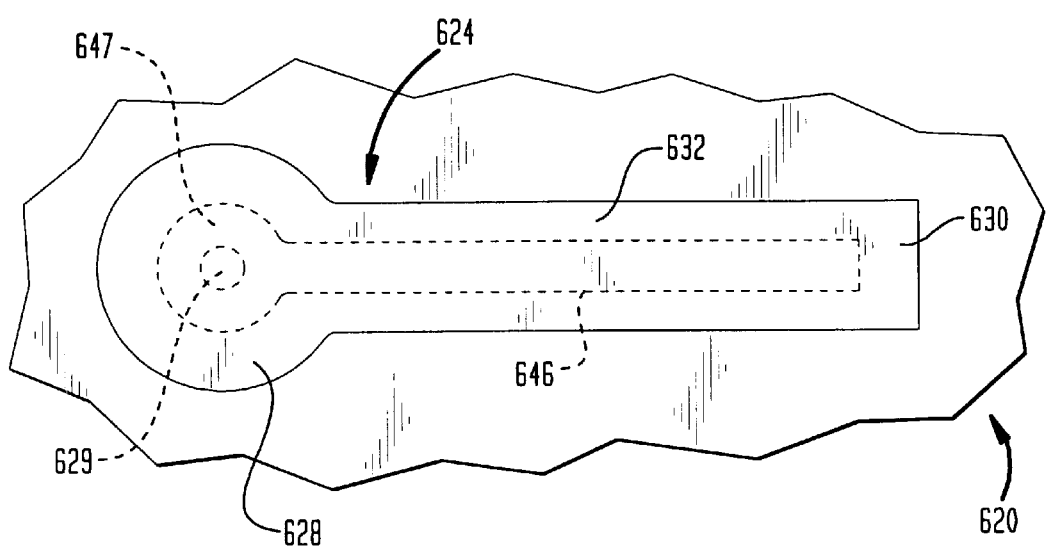
FIG. 23 is a diagrammatic plan view depicting a component in accordance with a further embodiment of the invention.

Progressive peeling as described with reference to FIGS. 23–24 may be applied to leads of different configurations. For example, the leads depicted in FIGS. 1–8 may be provided with elongated web-like connecting elements extending along the curved elongated sections 32, in addition to the small columnar connecting elements 46 at the tip ends, by terminating the etching process before erosion of the polymer beneath the elongated sections is complete. The web-like connecting element may be contiguous with the columnar connecting element.

Figure 20:
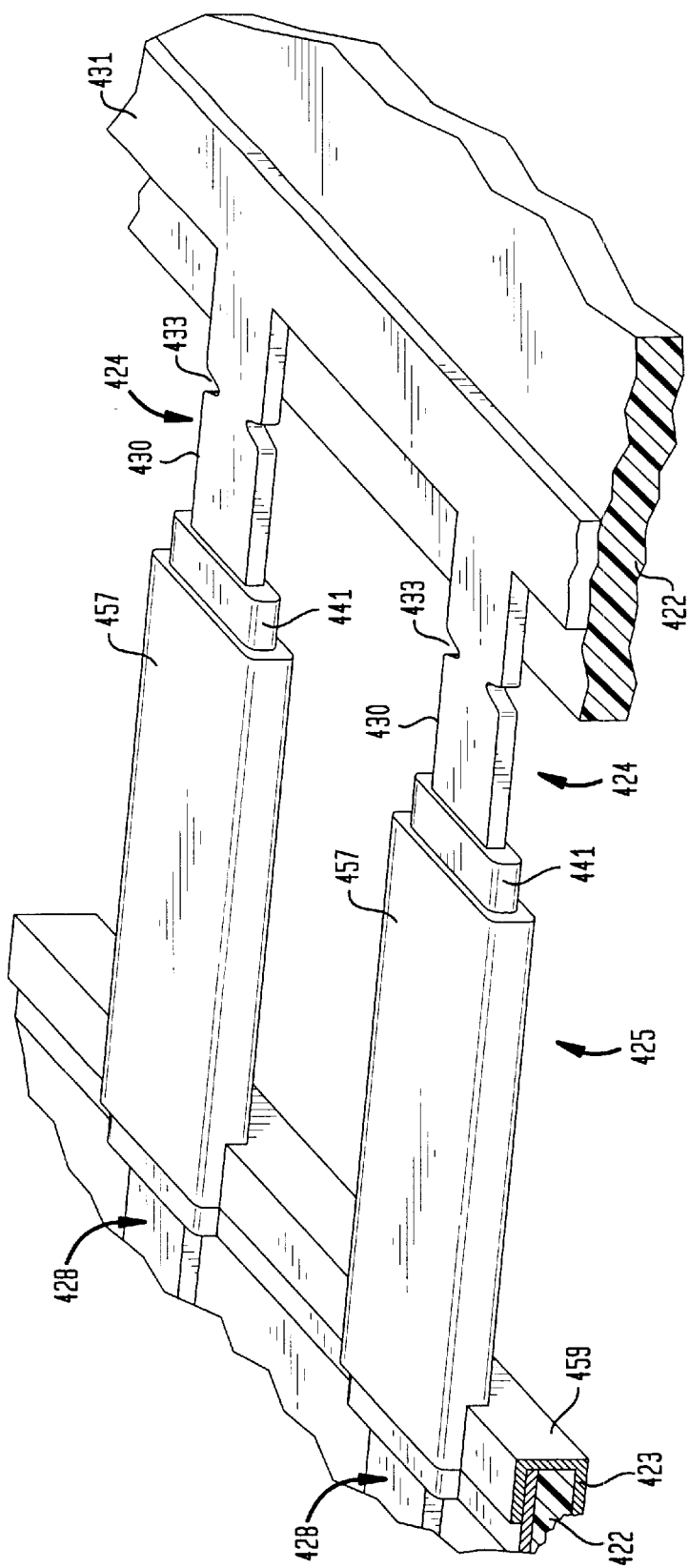
FIG. 20 is a fragmentary diagrammatic perspective view depicting a component in accordance with another embodiment of the invention.

Many other variations and combinations of the foregoing features may be employed. For example, the dielectric and metallic layers as discussed with reference to FIG. 20 can be provided on flexible leads which are supported at only one end by the dielectric support structure. Thus, the dielectric and metallic layers can be employed on leads of conventional tape automated bonding ("TAB") structures. Also, etchants other than the gaseous etchants discussed above can be employed. For example, conventional liquid etchants can be used to etch the polymeric layer. Also, the etching process can be controlled so that the elongated portions of the leads are not entirely detached from the polymeric layer, but instead remain attached to the polymeric layer by narrow, elongated web-like polymeric connecting elements extending lengthwise along the elongated portions. These web-like polymeric connecting elements can be torn progressively as the elongated portions of the leads are peeled away from the polymeric layer.

As these and other variations and combinations of the features discussed above can be utilized without departing from the present invention, the foregoing description of the preferred embodiments should be taken by way of illustration rather than by way of limitation of the invention as defined by the claims.

What is claimed is:

1. A microelectronic connection component, comprising:
    a support structure and one or more leads attached to said support structure and projecting from said support structure so that each said lead is movable independently of the others of said leads, each said lead having an elongated section spaced from said support structure so that said elongated section is movable with respect to said support structure, wherein said support structure includes a dielectric element;
    electrically conductive traces connected to said leads and extending across said dielectric element;
    a jacket of a dielectric material surrounding each said lead over at least a part of the elongated section of that lead;
    reference conductors surrounding and extending coaxially with said elongated sections of said leads and insulated therefrom by said jackets of dielectric material, said reference conductors including a coating of an electrically conductive material overlying at least parts of at least some of said dielectric jackets; and
    said support structure further comprising an electrically conductive potential reference element connected to at least some of said reference conductors.

2. A microelectronic connection component, comprising:
    a support structure and one or more leads attached to said support structure and projecting from said support structure so that each said lead is movable independently of the others of said leads, each said lead having an elongated section spaced from said support structure so that said elongated section is movable with respect to said support structure, wherein said support structure includes a dielectric element;
    a jacket of a dielectric material surrounding each said lead over at least a part of the elongated section of that lead;
    first electrically conductive traces connected to said leads and extending across said dielectric element;
    reference conductors surrounding and extending coaxially with said elongated sections of said leads and insulated therefrom by said jackets of dielectric material, said reference conductors including a coating of an electrically conductive material overlying at least parts of at least some of said dielectric jackets, wherein said support structure further includes second electrically conductive traces extending along said dielectric element and connected to at least some of said reference conductors.

3. An assembly including a component as claimed in claims 1 or 2 further comprising a microelectronic element having contacts thereon, at least some of said leads and at least some of said reference conductors being connected to said contacts.

4. An assembly as claimed in claim 3 wherein said microelectronic element includes one or more devices having a differential signal path connection to at least one pair of said contacts, and wherein said at least one pair of contacts is connected through a lead to a first trace and is connected through a conductive jacket of said lead to a second trace.

5. A connection component as claimed in claims 1 or claim 2 wherein said elongated sections have cross-sectional dimensions less than about 100 $\mu$m.

6. A component as claimed in claim 5 wherein said dielectric jackets are about 12 $\mu$m to about 50 $\mu$m thick.

7. A component as claimed in claim 6 wherein said coatings of electrically conductive material are less than about 25 $\mu$m thick.

8. A microelectronic connection component comprising:
    (a) a support structure including a polymeric dielectric layer having a surface extending in horizontal directions;

(b) one or more metallic conductive structures overlying said surface of said dielectric layer, said conductive structures having attachment portions vertically spaced from said surface;

(c) vertically extensive polymeric connecting elements integral with said dielectric layer extending between said surface and said attachment portions of said conductive structures so that said attachment portions overlie said connecting elements, each said connecting element having at least one horizontal dimension smaller than a corresponding horizontal dimension of the attachment portion overlying that connecting element.

9. A component as claimed in claim 8 wherein said connecting elements form releasable connections between said attachment portions and said support structure.

10. A component as claimed in claim 9 wherein said conductive structures include elongated leads, each said lead being attached to said support structure at an anchor location adjacent one end of such lead and having a releasable connection formed by one or more of said connecting elements adjacent the opposite end of such lead.

11. A component as claimed in claim 9 wherein said conductive structures include elongated leads, and wherein said connecting elements include elongated, web-like connecting elements narrower than the leads extending lengthwise along the leads.

12. A microelectronic connection component including a support structure and one or more leads attached to said support structure and projecting from said support structure so that each said lead is movable independently of the others of said leads, each said lead having an elongated section spaced from said support structure so that said elongated section is movable with respect to said support structure, the component further comprising a jacket of a dielectric material surrounding each said lead over at least a part of the elongated section of that lead, said component further comprising polymeric connecting elements extending between said support structure and said one or more leads.

13. The component of claim 12, wherein said connecting elements are each disposed at an end of one of said one or more leads.

* * * * *